(12) United States Patent
Bohannon

(10) Patent No.: US 10,382,054 B2
(45) Date of Patent: Aug. 13, 2019

(54) ANALOG FRONT END (AFE) FOR QUANTIZATION NOISE-LIMITED SENSOR APPARATUS

(71) Applicant: Synaptics Incorporated, San Jose, CA (US)

(72) Inventor: Eric Scott Bohannon, Henrietta, NY (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/809,284

(22) Filed: Nov. 10, 2017

(65) Prior Publication Data

US 2019/0149163 A1    May 16, 2019

(51) Int. Cl.
*G06F 3/044* (2006.01)
*H03M 3/00* (2006.01)
(Continued)

(52) U.S. Cl.
CPC ............ *H03M 3/322* (2013.01); *G06F 3/044* (2013.01); *G06F 3/0418* (2013.01);
(Continued)

(58) Field of Classification Search
CPC ........ H03M 3/322; H03M 3/464; H03M 3/32; H03M 3/462; H03M 3/494; H03M 3/458;
(Continued)

(56) References Cited

U.S. PATENT DOCUMENTS 5,311,181 A * 5/1994 Ferguson, Jr. ........... H03G 3/02
341/143
6,498,926 B1 * 12/2002 Ciccarelli ............. H03F 1/0261
455/240.1
(Continued)

OTHER PUBLICATIONS

J. Márkus, "Higher-order incremental delta-sigma analog-to-digital converters," Ph.D. dissertation, Budapest University of Technology and Economics, Department of Measurement and information Systems, Magyar tudósok körútja 2. H-1117 Budapest, Hungary, Mar. 2005, 132 p. [Online]. Available: http://www.mit.bme.hu/projects/delsig01/index.html.
(Continued)

*Primary Examiner* — Premal R Patel
(74) *Attorney, Agent, or Firm* — Paradice and Li LLP

(57) ABSTRACT

An analog front end (AFE) for an input device includes a current conveyor and an analog-to-digital converter (ADC) switchably coupled to the current conveyor. The current conveyor is configured to receive an input signal from a plurality of sensor electrodes. The ADC generates an output value corresponding to a digital representation of the input signal when the ADC is coupled to the current conveyor. Further, the ADC may selectively adjust the output value based at least in part on a state of the ADC when the ADC is decoupled from the current conveyor. In some implementations, the ADC may include a delta-sigma modulator configured to generate an additional sample when the ADC is decoupled from the current conveyor. The ADC may determine an amount of quantization error in the output
(Continued)

value based on the additional sample, and adjust the output value when the quantization error exceeds a threshold amount.

20 Claims, 7 Drawing Sheets

(51) Int. Cl.
*H03K 17/96* (2006.01)
*G06F 3/041* (2006.01)

(52) U.S. Cl.
CPC ............ *H03K 17/962* (2013.01); *H03M 3/32* (2013.01); *H03M 3/462* (2013.01); *H03M 3/464* (2013.01); *H03M 3/494* (2013.01)

(58) Field of Classification Search
CPC ........ H03M 1/12; G06F 3/044; G06F 3/0418; H03K 17/962
See application file for complete search history.

(56) References Cited

U.S. PATENT DOCUMENTS

| | | | |
|---|---|---|---|
| 2013/0136213 A1* | 5/2013 | Kobayashi | H03F 3/189 375/340 |
| 2016/0148034 A1* | 5/2016 | Kremin | G06K 9/0002 382/124 |
| 2017/0222657 A1* | 8/2017 | Ullmann | H03M 3/414 |
| 2018/0004353 A1* | 1/2018 | Shin | G02F 1/1343 |
| 2018/0059870 A1* | 3/2018 | Krah | G06F 3/0418 |
| 2018/0138920 A1* | 5/2018 | Sharma | A61B 5/04017 |
| 2018/0188844 A1* | 7/2018 | Khandelwal | G06F 3/044 |
| 2018/0260045 A1* | 9/2018 | Lee | G06F 3/03545 |
| 2018/0275823 A1* | 9/2018 | Lim | G06F 3/0418 |

OTHER PUBLICATIONS

Markus, J., Deval, P., Quiquempoix, V., Silva, J., & Temes, G. C. (Sep. 2006). Incremental delta-sigma structures for DC measurement: An overview. In Custom Integrated Circuits Conference, 2006. CICC'06. IEEE (pp. 41-48). IEEE.

* cited by examiner

ANALOG FRONT END (AFE) FOR QUANTIZATION NOISE-LIMITED SENSOR APPARATUS

TECHNICAL FIELD

The present embodiments relate generally to capacitive sensing, and specifically to mitigating quantization noise in capacitive sensing circuitry.

BACKGROUND OF RELATED ART

Input devices including proximity sensor devices (also commonly referred to as touchpads or touch sensor devices) are widely used in a variety of electronic systems. A proximity sensor device typically includes a sensing region, often demarked by an input surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Proximity sensors may operate by detecting changes in an electric field and/or capacitance in the sensing region. For example, the sensing region may include a number of conductors that can be configured to transmit and/or receive an electric signal. The signal can then be used to measure a capacitive coupling between various pairs of conductors. A "baseline" represents the expected capacitance for a pair of conductors when no external objects are present in the sensing region. Objects in contact with (or close proximity to) the sensing region may alter the effective capacitance of the conductors (e.g., from the baseline). Thus, a detected change in capacitance across one or more pairs of conductors may signal the presence and/or position of an object in the sensing region.

BRIEF DESCRIPTION OF THE DRAWINGS

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method of reducing power consumption for a quantization noise-limited sensor apparatus is disclosed. The method may be performed by an analog front end (AFE) for an input device. The AFE includes a current conveyor and an analog-to-digital converter (ADC) switchably coupled to the current conveyor. The current conveyor is configured to receive an input signal from the plurality of sensor electrodes. The ADC generates an output value corresponding to a digital representation of the input signal when the ADC is coupled to the current conveyor. Further, the ADC may selectively adjust the output value based at least in part on a state of ADC when the ADC is decoupled from the current conveyor.

In some embodiments, the AFE may include switching circuitry to selectively couple the ADC to the current conveyor. In some aspects, the switching circuitry may couple the ADC to the current conveyor during a sampling interval. In other aspects, the switching circuitry may decouple the ADC from the current conveyor upon termination of the sampling interval. For example, the sampling interval may correspond to the duration of a capacitive sensing operation (e.g., a burst duration) when the AFE is configured to operate in a low power mode.

The ADC may comprise a delta-sigma modulator and a decimation filter. The delta-sigma modulator may be configured to generate a series of samples based at least in part on the received input signal. The decimation filter may be configured to convert the series of samples to the output value when the ADC is coupled to the current conveyor. In some embodiments, the delta-sigma modulator may be further configured to generate an additional sample when the ADC is decoupled from the current conveyor. The ADC may determine an amount of quantization error in the output value based on the additional sample, and may adjust the output value when the quantization error exceeds a threshold amount. In some aspects, the decimation filter may comprise an up-down counter configured to increment the output value when the quantization error exceeds the threshold amount, and maintain the output value when the quantization error does not exceed the threshold amount.

The delta-sigma modulator may further include an integrator and a feedback digital-to-analog converter (DAC). In some embodiments, the ADC may be configured to decouple the feedback DAC from the integrator prior to generating the first sample in the series of samples. When a threshold period has elapsed, after receiving the input signal from the current conveyor, the ADC may couple the feedback DAC to the integrator. For example, the threshold period may be based at least in part on a sampling frequency of the delta-sigma modulator and a return-to-zero time of a clock signal used to control the sampling frequency.

BRIEF DESCRIPTION OF THE DRAWINGS

The present embodiments are illustrated by way of example and are not intended to be limited by the figures of the accompanying drawings.

Figure 1:
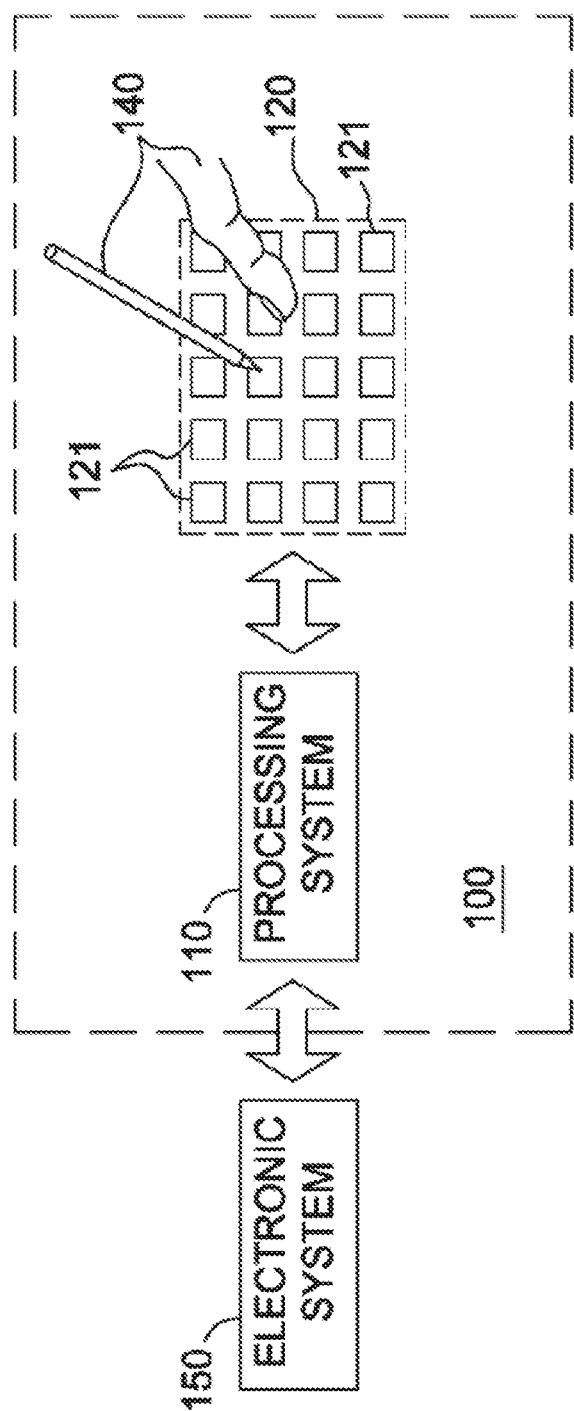

FIG. 1 shows an example input device within which the present embodiments may be implemented.

Figure 2:
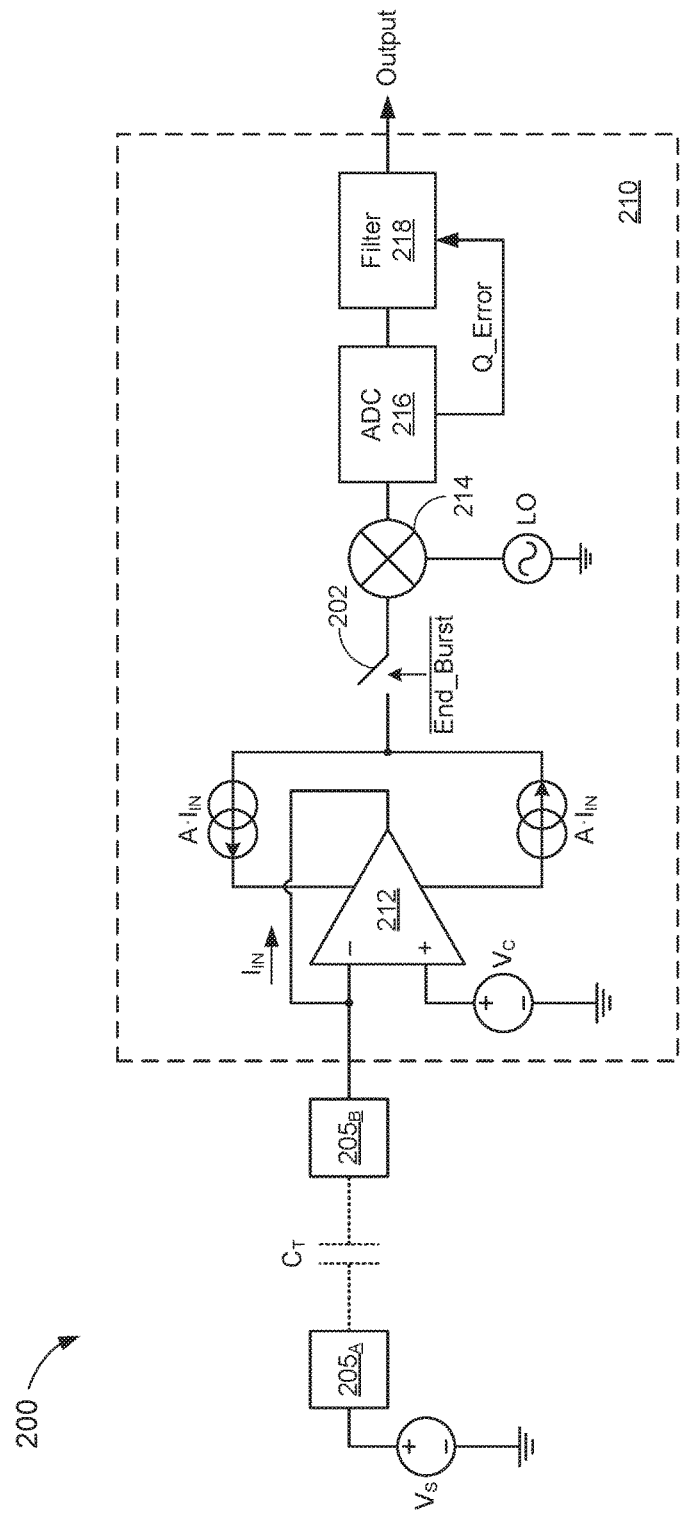

FIG. 2 shows a circuit diagram depicting an analog front end (AFE) for at least a portion of an input device, in accordance with some embodiments.

Figure 3:
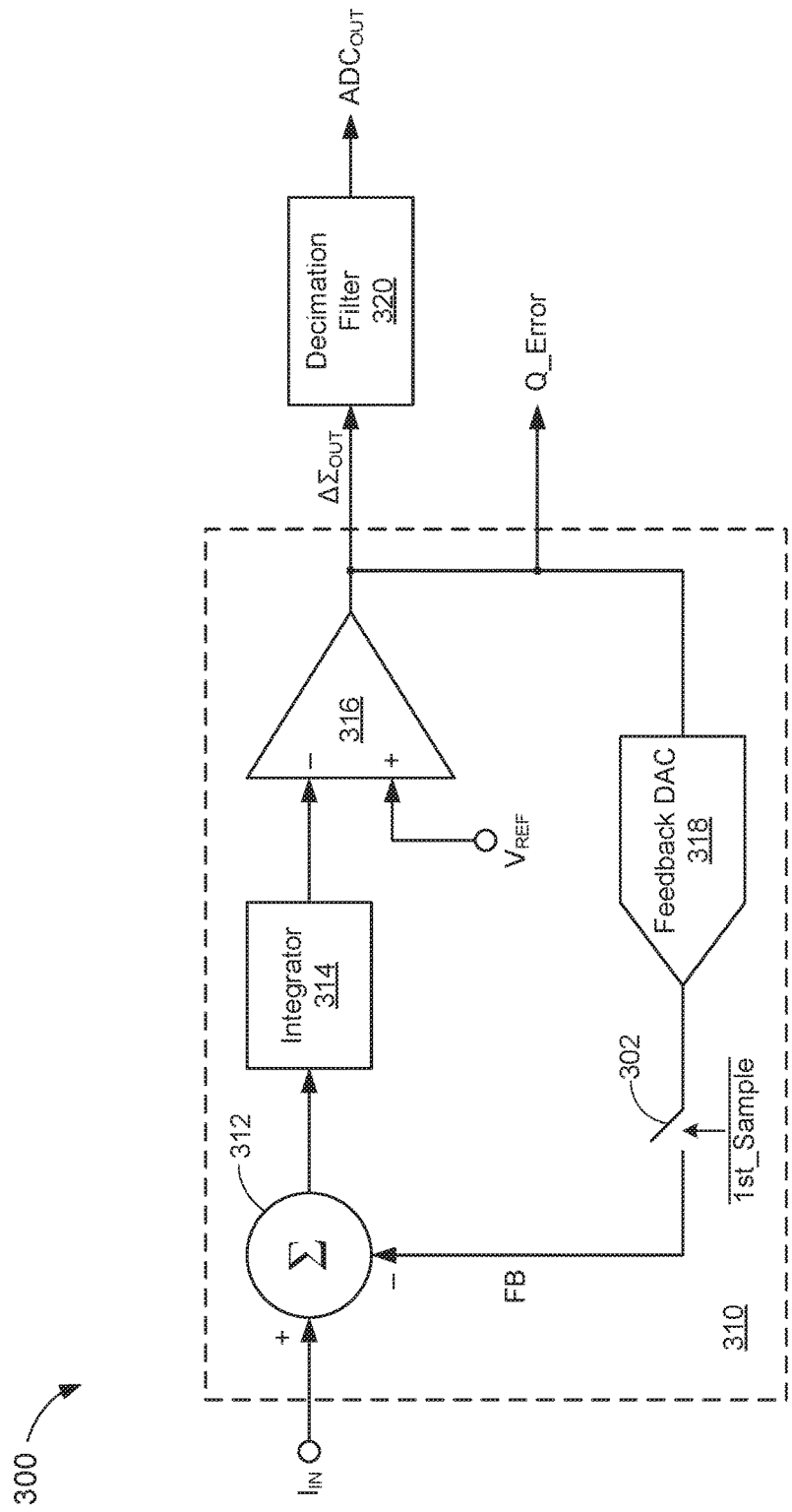

FIG. 3 shows a block diagram of an analog-to-digital converter (ADC), in accordance with some embodiments.

Figure 4:
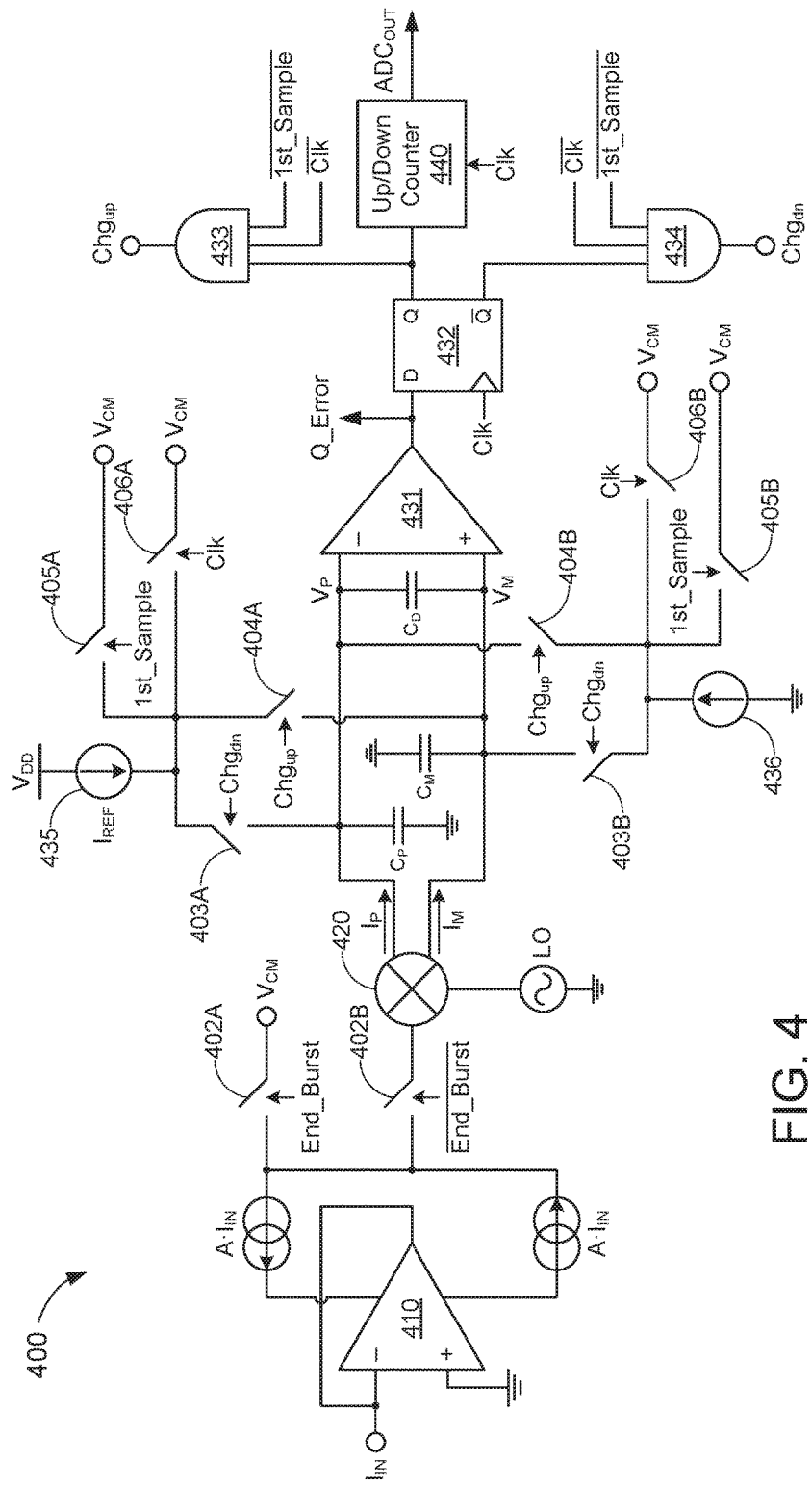

FIG. 4 shows a circuit diagram of an AFE with quantization noise (QN) adjustment circuitry, in accordance with some embodiments.

Figure 5:
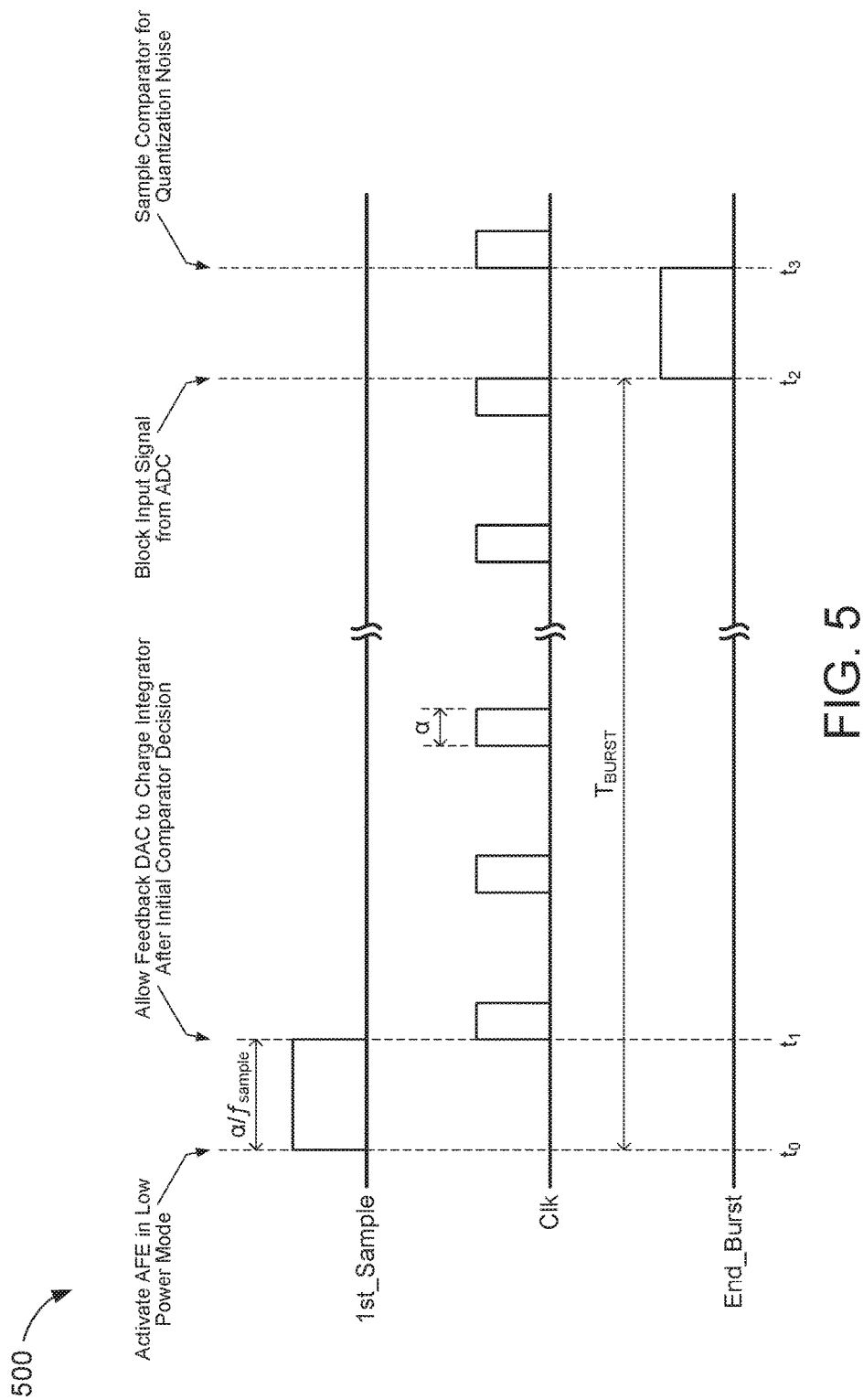

FIG. 5 shows a timing diagram illustrating an example operation of the AFE depicted in FIG. 4.

Figure 6:
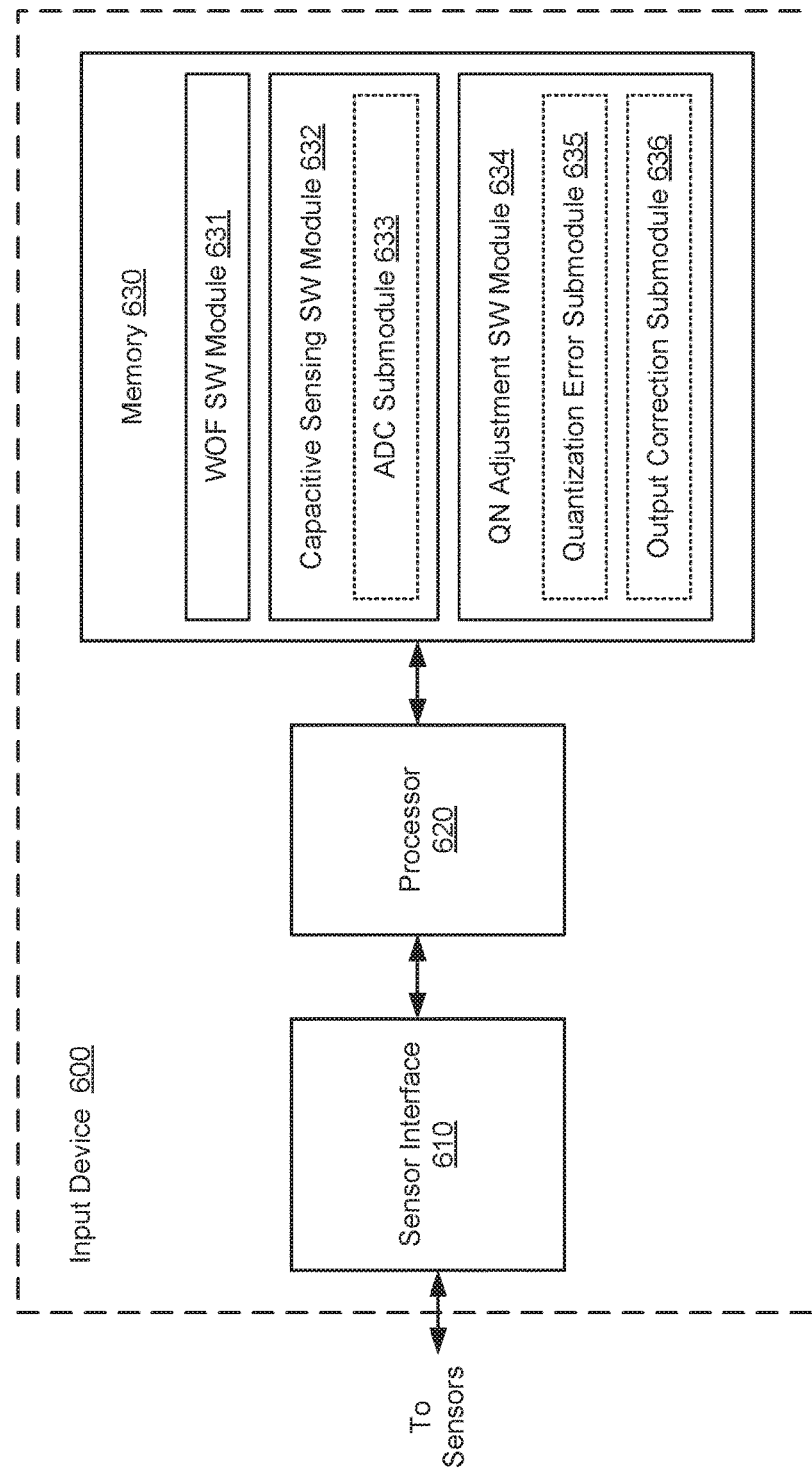

FIG. 6 shows a block diagram of an input device with QN adjustment capabilities, in accordance with some embodiments.

Figure 7:
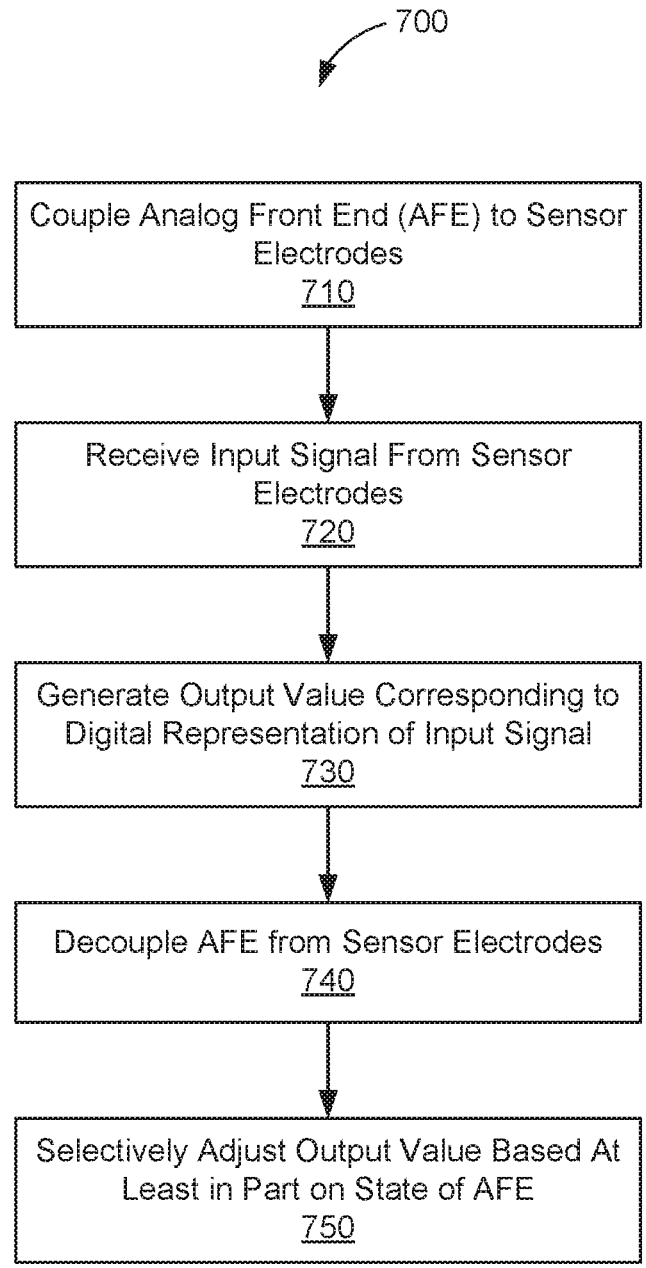

FIG. 7 shows an illustrative flowchart depicting an example operation for selectively adjusting a digital output of an analog-to-digital converter (ADC), in accordance with some embodiments.

DETAILED DESCRIPTION

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory. The interconnection between circuit elements or software blocks may be shown as buses or as single signal lines. Each of the buses may alternatively be a single signal line, and each of the single signal lines may alternatively be buses, and a single line or bus may represent any one or more of a myriad of physical or logical mechanisms for communication between components.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory computer-readable storage medium comprising instructions that, when executed, performs one or more of the methods described above. The non-transitory computer-readable storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory.

FIG. 1 shows an example input device 100 within which the present embodiments may be implemented. The input device 100 includes a processing system 110 and a sensing region 120. The input device 100 may be configured to provide input to an electronic system (not shown for simplicity). Examples of electronic systems may include personal computing devices (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones such as smart phones), and media devices (e.g., recorders, editors, and players such as televisions, set-top boxes, music players, digital photo frames, and digital cameras).

In some aspects, the input device 100 may be implemented as a physical part of the corresponding electronic system. Alternatively, the input device 100 may be physically separated from the electronic system. The input device 100 may be coupled to (and communicate with) components of the electronic system using various wired and/or wireless interconnection and communication technologies, such as buses and networks. Example technologies may include Inter-Integrated Circuit ($I^2C$), Serial Peripheral Interface (SPI), PS/2, Universal Serial bus (USB), Bluetooth®, Infrared Data Association (IrDA), and various radio frequency (RF) communication protocols defined by the IEEE 802.11 standard.

In the example of FIG. 1, the input device 100 may correspond to a position sensor device (e.g., also referred to as a "touchpad," "touch sensor device," or "proximity sensor device") configured to sense input provided by one or more input objects 140 in the sensing region 120. Example input objects 140 include fingers, styli, and the like. The sensing region 120 may encompass any space above, around, in, and/or proximate to the input device 100 in which the input device 100 is able to detect user input (such as provided by one or more input objects 140). The size, shape, and/or location of the sensing region 120 (e.g., relative to the electronic system) may vary depending on actual implementations.

In some embodiments, the sensing region 120 may extend from a surface of the input device 100 in one or more directions in space, for example, until a signal-to-noise ratio (SNR) of the sensors falls below a threshold suitable for object detection. For example, the distance to which the sensing region 120 extends in a particular direction may be on the order of less than a millimeter, millimeters, centimeters, or more, and may vary with the type of sensing technology used and/or accuracy desired. In some embodiments, the sensing region 120 may detect inputs involving no physical contact with any surfaces of the input device 100, contact with an input surface (e.g., a touch surface and/or screen) of the input device 100, contact with an input surface of the input device 100 coupled with some amount of applied force or pressure, and/or any combination thereof.

In some embodiments, input surfaces may be provided by, and/or projected on, one or more surfaces of a housing of the input device 100 (e.g., as an image). For example, the sensing region 120 may have a rectangular shape when projected onto an input surface of the input device 100. In some aspects, inputs may be provided through images spanning one, two, three, or higher dimensional spaces in the sensing region 120. In some other aspects, inputs may be provided through projections along particular axes or planes in the sensing region 120. Still further, in some aspects, inputs may be provided through a combination of images and projections in the sensing region 120.

The input device 100 may utilize various sensing technologies to detect user input. Example sensing technologies may include capacitive, elastive, resistive, inductive, magnetic, acoustic, ultrasonic, and optical sensing technologies. In some embodiments, the input device 100 may utilize capacitive sensing technologies to detect user inputs. For example, the sensing region 120 may include one or more capacitive sensing elements 121 (e.g., sensor electrodes) to create an electric field. The input device 100 may detect inputs based on changes in capacitance of the sensing elements 121. For example, an object in contact with (or close proximity to) the electric field may cause changes in the voltage and/or current in the sensing elements 121. Such changes in voltage and/or current may be detected as "signals" indicative of user input. The sensing elements 121 may be arranged in arrays or other configurations to detect inputs at multiple points within the sensing region 120. In some aspects, some sensing elements 121 may be ohmically shorted together to form larger sensor electrodes. Some capacitive sensing technologies may utilize resistive sheets that provide a uniform layer of resistance.

Example capacitive sensing technologies may be based on "self-capacitance" (also referred to as "absolute capacitance") and/or "mutual capacitance" (also referred to as "transcapacitance"). Absolute capacitance sensing methods detect changes in the capacitive coupling between one or more of the sensing elements 121 and an input object. For example, an input object near one or more of the sensing elements 121 may alter the electric field near the sensing elements 121, thus changing the measured capacitive coupling between two or more sensor electrodes of the sensing elements 121. In some embodiments, the input device 100 may implement absolute capacitance sensing by modulating sensor electrodes with respect to a reference voltage and detecting the capacitive coupling between the sensor electrodes and input objects. The reference voltage may be substantially constant or may vary. In some aspects, the reference voltage may correspond to a ground potential.

Transcapacitance sensing methods detect changes in the capacitive coupling between sensor electrodes. The change in capacitive coupling may be between sensor electrodes in two different sensing elements 121 or between two different sensor electrodes in the same sensing element 121. For example, an input object near the sensor electrodes may alter the electric field between the sensor electrodes, thus changing the measured capacitive coupling of the sensor electrodes. In some embodiments, the input device 100 may implement transcapacitance sensing by detecting the capacitive coupling between one or more "transmitter" sensor electrodes and one or more "receiver" sensor electrodes. Transmitter sensor electrodes may be modulated relative to the receiver sensor electrodes. For example, the transmitter sensor electrodes may be modulated relative to a reference voltage to transmit signals, while the receiver sensor electrodes may be held at a relatively constant voltage to "receive" the transmitted signals. The signals received by the receiver sensor electrodes may be affected by environmental interference (e.g., from other electromagnetic signals and/or objects in contact with, or in close proximity to, the sensor electrodes). In some aspects, each sensor electrode may either be a dedicated transmitter or a dedicated receiver. In other aspects, each sensor electrode may be configured to transmit and receive.

The processing system 110 may be configured to operate the hardware of the input device 100 to detect input in the sensing region 120. In some embodiments, the processing system 110 may control one or more sensor electrodes to detect objects in the sensing region 120. For example, the processing system 110 may be configured to transmit signals via one or more transmitter sensor electrodes and receive signals via one or more receiver sensor electrodes. In some aspects, one or more components of the processing system 110 may be co-located, for example, in close proximity to the sensing elements of the input device 100. In other aspects, one or more components of the processing system 110 may be physically separated from the sensing elements of the input device 100. For example, the input device 100 may be a peripheral coupled to a computing device, and the processing system 100 may be implemented as software executed by a central processing unit (CPU) of the computing device. In another example, the input device 100 may be physically integrated in a mobile device, and the processing system 110 may correspond, at least in part, to a CPU of the mobile device.

In some embodiments, the processing system 110 may be implemented as a set of modules that are implemented in firmware, software, or a combination thereof. Example modules include hardware operation modules for operating hardware such as sensor electrodes and display screens; data processing modules for processing data such as sensor signals and positional information; and reporting modules for reporting information. In some embodiments, the processing system 110 may include sensor operation modules configured to operate sensing elements to detect user input in the sensing region 120; identification modules configured to identify gestures such as mode changing gestures; and mode changing modules for changing operation modes of the input device 100 and/or electronic system.

The processing system 110 may respond to user input in the sensing region 120 by triggering one or more actions. Example actions include changing an operation mode of the input device 110 and/or graphical user interface (GUI) actions such as cursor movement, selection, menu navigation, and the like. In some embodiments, the processing system 110 may provide information about the detected input to the electronic system (e.g., to a CPU of the electronic system). The electronic system may then process information received from the processing system 110 to carry out additional actions (e.g., changing a mode of the electronic system and/or GUI actions).

The processing system 110 may operate the sensing elements of the input device 100 to produce electrical signals indicative of input (or lack of input) in the sensing region 120. The processing system 110 may perform any appropriate amount of processing on the electrical signals to translate or generate the information provided to the electronic system. For example, the processing system 110 may digitize analog signals received via the sensor electrodes and/or perform filtering or conditioning on the received signals. In some aspects, the processing system 110 may subtract or otherwise account for a "baseline" associated with the sensor electrodes. For example, the baseline may represent a state of the sensor electrodes when no user input is detected. In some embodiments, the processing system 110 may further determine positional information for a detected input. The term "positional information," as used herein, refers to any information describing or otherwise indicating a position or location of the detected input (e.g., within the sensing region 120). Example positional information may include absolute position, relative position, velocity, acceleration, and/or other types of spatial information.

It is noted that the input device 100 may experience long idle periods during which no input object is detected in the sensing region 120. To conserve power, the input device 100 may operate in a low power mode during such periods of inactivity. For example, the input device 100 may deactivate its capacitive sensing circuitry (including the sensor electrodes 121 and/or various components of the processing system 110) when no user inputs have been detected for at least a threshold duration. However, the input device 100 may periodically reactivate the sensor electrodes 121 for at least a brief (e.g., "burst") duration to ensure that it does not miss any input objects that may have entered the sensing region 120. If no input object is detected by the end of the burst, the input device 100 may return to the low power mode. However, if the input device 100 detects an input object in the sensing region 120, the input device 100 may exit the low power mode (e.g., by maintaining the capacitive sensing circuitry in a constant-on state and/or reactivating any additional sensor-related circuitry). Thus, in some embodiments, the low power mode may be referred to as a "wake-on-finger" (WOF) mode.

As described above, one of the primary motivations behind the WOF mode is to reduce power consumption. Since the greatest amount of power is consumed during the short bursts when the capacitive sensing circuitry is reactivated, it may be desirable to reduce and/or minimize the duration of the bursts. However, the capacitive sensing circuitry may be quantization noise-limited when operating in the WOF mode. For example, there may be a minimum or threshold resolution at which the capacitive sensing circuitry should sample the sensor electrodes 121 to detect an input object in the sensing region 120. Since reducing the sampling duration also reduces the resolution of the capacitive sensing information (e.g., as fewer samples are taken), conventional input devices must typically remain active for a threshold burst duration to achieve the given resolution. However, aspects of the present disclosure may enable the input device 100 to achieve the same resolution while remaining active for less than the threshold burst duration. Thus, the input device 100 may achieve even greater power savings when operating in the WOF mode.

In some embodiments, the input device 100 may maintain a threshold quantization noise (or resolution) while performing a capacitive sensing operation in less time than that of a conventional input device. In some other embodiments, the input device 100 may achieve a lower quantization noise (or higher resolution) when performing a capacitive sensing operation in the same amount of time as a conventional input device. More specifically, aspects of the present disclosure may leverage existing capacitive sensing circuitry of the input device 100 to convert an analog input signal to a digital output value. In some aspects, the input device 100 may determine an amount of quantization error in the digital output value by switchably coupling and decoupling an analog front end (AFE) from the sensor electrodes 121, and may selectively adjust the digital output value based at least in part on the amount of quantization error.

FIG. 2 shows a circuit diagram depicting an analog front end (AFE) 210 for at least a portion of an input device 200, in accordance with some embodiments. The AFE 210 is coupled to a pair of sensor electrodes $205_A$ and $205_B$. For example, the sensor electrodes $205_A$ and $205_B$ may correspond to any pair of adjacent sensor electrodes 121 of the input device 100 depicted in FIG. 1. In some embodiments, the AFE 210 may be switchably coupled to the sensor electrodes $205_A$ and $205_B$ based at least in part on an operating mode of the input device 200. For example, the AFE 210 may be decoupled from the sensor electrodes $205_A$ and $205_B$ when the input device 200 operates in a low power (or WOF) mode. While operating in the low power mode, the AFE 210 may be periodically coupled to the sensor electrodes $205_A$ and $205_B$ for a relatively short burst duration.

The AFE 210 includes a current conveyor 212, a mixer 214, an analog-to-digital converter (ADC) 216, and a filter 218. In some embodiments, the current conveyor 212 may be an operation amplifier (op amp) having an inverting input (−) terminal coupled to the sensor electrode $205_B$ and a non-inverting input (+) terminal coupled to a voltage source $V_C$. The output terminal of the op amp is coupled to the inverting input terminal (e.g., in a negative feedback configuration). Thus, the "output" of the current conveyor 212 may be an amplified (or attenuated) signal provided across the voltage supply terminals of the op amp. The mixer 214 may be coupled to receive an output signal form the current conveyor 212, and may be configured to down-convert or demodulate the received signal to a lower frequency by mixing the received signal with a reference signal generated by a local oscillator (LO). The ADC 216 may be configured to receive the demodulated signal from the mixer 214 and convert the analog input signal to a digital bit stream. In some embodiments, the ADC 216 may include a delta-sigma ($\Delta\Sigma$) modulator that generates a single-bit stream at a sampling frequency of its internal clock (e.g., 20 MHz). The ADC 216 may further include a decimation filter to convert the digital bit stream to a quantized value.

In some embodiments, the filter 218 may be configured to filter quantization noise from the output of the $\Delta\Sigma$ modulator to produce a higher-resolution quantized value at the output of the AFE 210. For example, the filter 218 may determine an amount of quantization error in the digital output from the ADC 216, and may selectively adjust the output based on the amount of quantization error. In some embodiments, the filter 218 may measure the quantization error based, at least in part, on a state of the ADC 216 when the AFE 210 (and/or the ADC 216) is decoupled from the sensor electrodes $205_A$ and $205_B$. The filter 218 may then use the quantization error to improve the resolution of the digital output for a given sampling (or burst) duration.

The AFE 210 may be configured to generate capacitive sensing information by sampling an input current ($I_{IN}$) received from the sensor electrodes $205_A$ and $205_B$. More specifically, the input current $I_{IN}$ may be generated based on a voltage bias applied across the sensor electrodes $205_A$ and $205_B$. For example, the voltage at sensor electrode $205_A$ may be provided by the voltage source $V_S$ and the voltage at sensor electrode $205_B$ may be provided by the inverting terminal of the current conveyor 212. Since the voltage at the non-inverting terminal of the current conveyor 212 is provided by the adjustable voltage source $V_C$, the voltage at the inverting terminal of the current conveyor 212 will also be equal to $V_C$ (e.g., as the op amp tries to equalize the voltages at its input terminals). Thus, the biasing of the sensor electrodes $205_A$ and $205_B$ may correspond to the difference in voltage between the voltage source $V_S$ and the adjustable voltage source $V_C$ (e.g., $V_{AB}=V_S-V_C$).

At least one of the voltages $V_S$ and/or $V_C$ may be "programmable" (e.g., controlled or adjusted by a controller or processor of the AFE 210). More specifically, the biasing of the voltages $V_S$ and $V_C$ may affect the voltage that is "transmitted" to the sensor electrodes $205_A$ and $205_B$ (e.g., the results of which are received by the AFE 210 as an input current $I_{IN}$). In some aspects, the voltage supply $V_S$ may provide a fixed supply voltage whereas the voltage source $V_C$ may provide a variable control voltage that may be controlled or adjusted by a controller or processor of the AFE 310. For example, one of the voltages $V_S$ or $V_C$ may be a ground potential. In other aspects, each of the voltages $V_S$ and $V_C$ may be controlled or adjusted by a controller or processor of the AFE 210. Because the current conveyor 212 has a limited dynamic range, the voltages $V_C$ and/or $V_S$ may be selected to ensure that the input current $I_{IN}$ does not exceed the dynamic range of the current conveyor 212.

In some embodiments, the AFE 210 may further include switching circuitry 202 configured to switchably couple and/or decouple the sensor electrodes $205_A$ and $205_B$ from at least a portion of the AFE 210. More specifically, the switching circuitry 202 may be configured to couple the current conveyor 212 to the mixer 214 at the start of a sampling duration (e.g., when operating in the low power or WOF mode), and decouple the current conveyor 212 from the mixer 214 at the end of the sampling duration (e.g. when operating in the lower power or WOF mode). In the example of FIG. 2, the switching circuitry 202 is depicted as a switch that is controlled by an end-of-burst (End_Burst) signal. For example, the switching circuitry 202 may operate as a closed switch when the End_Burst signal is deasserted (e.g., indicating that sampling period has not yet terminated), and may operate as an open switch when the End_Burst signal is asserted (e.g., indicating that the sampling period has terminated). However, it is noted that in actual implementations the switching circuitry 202 may be implemented by any circuitry capable of performing similar switching functions.

When performing a capacitive sensing operation, the End_Burst signal is deasserted and the switching circuitry 202 is closed. A time-varying voltage (such as provided by an alternating current (AC) voltage source) may be applied to the sensor electrodes $205_A$ and $205_B$. For example, the time-varying voltage may be generated by varying the amplitude of the adjustable voltage source $V_C$ relative to the voltage source $V_S$. The time-varying voltage produces a corresponding time-varying input current $I_{IN}$ having a frequency corresponding to a rate of the voltage change. The input current $I_{IN}$ is amplified by the current conveyor 212 based on a gain (A). Since the switching circuitry 202 is closed, the mixer 214 receives the amplified input current $A \cdot I_{IN}$ from the current conveyor 212 and demodulates the received input current $A \cdot I_{IN}$ using the local oscillator signal. The ADC 216 converts the demodulated signal into a digital stream of bits, and the filter 218 filters the bits to improve the resolution of the digital bit stream at the output of the AFE 210. Accordingly, the digital (quantized) representation of the input current $I_{IN}$ (e.g., at the output of the AFE 210) may be used to derive the capacitance CT across the sensor electrodes $205_A$ and $205_B$ $$\left(\text{e.g., } i_{IN}(t) = C_T \frac{dv_{AB}(t)}{dt}\right).$$

At the end of the sampling (burst) duration, the End_Burst signal is asserted and the switching circuitry 202 is opened. This prevents the input current $I_{IN}$ from entering the mixer 214 and/or being sampled by the ADC 216. In some embodiments, the ADC 216 may continue "sampling" when the mixer 214 is decoupled from the current conveyor 212. As described in greater detail below, the extended sampling may reflect an amount of quantization error in the digital output of the ADC 216. In some embodiments, the filter 218 may receive the additional sample as a "quantization error" (Q_Error) signal from the ADC 216. The filter 218 may then selectively adjust the output of the ADC 216 based at least in part on the received quantization error. For example, in some aspects, the filter 218 may increment (or decrement) the value output of the ADC 216 if the quantization error exceeds a threshold amount. In other aspects, the filter 218 may maintain the output of the ADC 216 (e.g., without any adjustment) if the quantization error does not exceed the threshold amount.

Among other advantages, knowledge of the quantization error (e.g., when the mixer 214 is decoupled from the current conveyor 212) allows the filter 218 to increase the resolution at the output of the ADC 216. More specifically, the AFE 210 may achieve a 1-bit increase in resolution by capturing just one additional "sample" in the ADC 216. In contrast, a conventional ADC would need to acquire twice as many samples to achieve an equivalent 1-bit increase in resolution. Accordingly, the AFE 210 may maintain a threshold level of quantization noise while performing a capacitive sensing operation in half the time it would take a conventional ADC to achieve the same level of quantization noise. This allows the AFE 210 to perform a WOF sensing operation in a shorter burst duration, thus reducing the overall power consumption of the input device 200.

FIG. 3 shows a block diagram of an analog-to-digital converter (ADC) 300, in accordance with some embodiments. The ADC 300 may be an example embodiment of the ADC 216 of the AFE 210 depicted in FIG. 2. For example, the ADC 300 may be used to sample and convert a time-varying analog input signal $I_{IN}$ (e.g., corresponding to a current received via one or more sensor electrodes) to a corresponding digital value. The ADC 300 may comprise a delta-sigma modulator 310 and a decimation filter 320.

The delta-sigma modulator 310 may be configured to generate a series of samples (or pulses) based on an amplitude of the input signal $I_{IN}$ at any given time. In some embodiments, the delta-sigma modulator 310 may include a differencing circuit 312, an integrator 314, a comparator 316, and a feedback digital-to-analog converter (DAC) 318. The differencing circuit 312 is configured to output a difference between the input signal $I_{IN}$ and a feedback signal (FB) generated by the feedback DAC 318. The integrator 314 is configured to sum or integrate the differences output by the differencing circuit 312 over a period of time. The comparator 316 is configured to compare the value stored by the integrator 314 with a threshold value ($V_{REF}$) and generate a binary output ($\Delta\Sigma_{OUT}$) based on the comparison. For example, the comparator 316 may output a logic "1" if the value stored by the integrator 314 exceeds the threshold value, and may output a logic "0" if the value stored by the integrator 314 does not exceed the threshold value. The feedback DAC 318 is configured to convert the binary output $\Delta\Sigma_{OUT}$ to an analog voltage or current, which is provided to the differencing circuit 312 (e.g., as the feedback signal FB).

In some embodiments, the feedback DAC 318 may be switchably coupled to the differencing circuit 312 via switching circuitry 302. More specifically, the switching circuitry 302 may be configured to prevent the feedback signal FB from interfering with the input signal $I_{IN}$ before a first sample has been taken by the delta-sigma modulator 310. For example, the integrator 314 may store a residual charge at the start of a sampling interval. As a result, the comparator 316 (and the feedback DAC 318) may output a value that is not representative of the actual input signal $I_{IN}$. By decoupling the feedback DAC 318 from the differencing circuit 312, the switching circuitry 302 may prevent the initial feedback signal FB from interfering with the input signal $I_{IN}$, thus ensuring that the first sample generated by the delta-sigma modulator 310 accurately reflects the current state of the input signal $I_{IN}$. This may further improve the accuracy and/or resolution of the output of the ADC 300.

In the example of FIG. 3, the switching circuitry 302 is depicted as a switch that is controlled by a first-sample (1st_Sample) signal. For example, the switching circuitry 302 may operate as an open switch when the 1st_Sample signal is asserted (e.g., indicating that the delta-sigma modulator 310 is about to take a first sample of the input current $I_{IN}$), and may operate as a closed switch when the 1st_Sample signal is deasserted (e.g., indicating that the delta-sigma modulator 310 has taken the first sample of the input current $I_{IN}$). However, it is noted that in actual implementations the switching circuitry 302 may be implemented by any circuitry capable of performing similar switching functions.

The decimation filter 320 is coupled to receive the output of the delta-sigma modulator 310, and configured to convert the binary output $\Delta\Sigma_{OUT}$ to a quantized value ($ADC_{OUT}$). In some embodiments, the decimation filter 320 may be implemented as an up/down counter. For example, the decimation filter 320 may count the number of pulses (e.g., 1's) output by the delta-sigma modulator 310 to determine a digital representation of the input signal $I_{IN}$ for a given sampling interval (e.g., burst duration). More specifically, the decimation filter 320 may increment the count value for each "1" output by the delta-sigma modulator 310, and may decrement the count value for each "0" (or "−1") output by the delta-sigma modulator 310. The final count value stored by the decimation filter 320 at the end of the sampling interval may be output as a digital representation ($ADC_{OUT}$) of the input signal $I_{IN}$.

As described above, the ADC 300 may be prevented from receiving the input signal $I_{IN}$ at the end of a sampling or burst duration (e.g., when the mixer 214 is decoupled from the current conveyor 212 via the open switch 202). In some embodiments, the ADC 300 may be configured to generate an additional sample when no input signal $I_{IN}$ is received. As described in greater detail below, the voltage stored on the integrator 314 at the end of the burst duration may correspond to an analog measure of the quantization error in $ADC_{OUT}$. Thus, the output of the comparator 316 may indicate whether the quantization error exceeds a threshold level (e.g., such that the least significant bit (LSB) of $ADC_{OUT}$ should be adjusted). In some embodiments, the output of the comparator 316 may be provided (e.g., as a Q_Error signal) to a quantization noise adjustment circuit (such as the filter 218 of FIG. 2) to selectively adjust the output of the ADC 300. For example, if the Q_Error signal represents a logic "0" then the quantization error may not exceed a threshold level that would warrant adjusting $ADC_{OUT}$. However, if the Q_Error signal represents a logic "1" then the quantization error may exceed the threshold level, and the output of the ADC 300 may be incremented (or decremented) by a single bit value. Thus, by preventing the ADC 300 from receiving the input current $I_{IN}$ at the end of a given burst duration, the resolution of $ADC_{OUT}$ may be improved by 1 bit.

FIG. 4 shows a circuit diagram of an AFE 400 with quantization noise (QN) adjustment circuitry, in accordance with some embodiments. The AFE 400 may be an example embodiment of the AFE 210 depicted in FIG. 2. For example, the AFE 400 may be coupled to one or more sensor electrodes (not shown for simplicity) and used for generating capacitive sensing information. The AFE 400 may comprise a current conveyor 410, a mixer 420, a delta-sigma modulator (e.g., circuit components 431-436 and capacitors $C_P$, $C_M$, and $C_D$), and an up/down counter 440.

The current conveyor 410 may be an example embodiment of (and perform substantially the same functions as) the current conveyor 212 of FIG. 2. Thus, the current conveyor 410 may be configured to amplify (or attenuate) an input current $I_{IN}$ received via one or more sensor electrodes. The mixer 420 may be coupled to receive the amplified input current $A \cdot I_{IN}$ from the current conveyor 410, and may be configured to demodulate the received signal into "plus" and "minus" component currents ($I_P$ and $I_M$, respectively) by mixing the amplified input current $A \cdot I_{IN}$ with a reference signal generated by a local oscillator (LO). For example, the component currents $I_P$ and $I_M$ may correspond to a differential voltage centered around a common-mode voltage potential ($V_{CM}$). Although not shown for simplicity, the AFE 400 may include additional circuitry for centering the component currents $I_P$ and $I_M$ about the common-mode voltage $V_{CM}$.

The component currents $I_P$ and $I_M$ may be stored (e.g., as charge) on the capacitors $C_D$, $C_P$ and $C_M$, respectively. In some embodiments, the capacitors $C_D$, $C_P$ and $C_M$ may function as integrators (such as the integrator 314 of FIG. 3) for the delta-sigma modulator. The comparator 431 is configured to compare the voltages $V_P$ and $V_M$ stored on the capacitors $C_D$, $C_P$ and $C_M$, respectively, and generate a binary output based on the comparison. For example, the comparator 431 may output a logic "1" if the upper voltage $V_P$ is greater than the lower voltage $V_M$, and may output a logic "0" if the lower voltage $V_M$ is greater than the upper voltage $V_P$.

The flip-flop 432 stores the output of the comparator 431, and may adjust the voltages $V_P$ and $V_M$ based on the comparison. For example, the output (Q) of the flip-flop 432 may be coupled to an AND logic gate 433 that outputs a charge-up ($Chg_{up}$) signal based on respective logic states of the output Q, a clock signal (Clk), and a first-sample (1st_Sample) signal. In the example of FIG. 4, the AND gate 433 may assert the $Chg_{up}$ signal when the output Q is a logic "1" and the Clk and 1st_Sample signals are in a logic-low state. The complementary output ($\overline{Q}$) of the flip-flop 432 may be coupled to an AND logic gate 434 that outputs a charge-down ($Chg_{dn}$) signal based on respective logic states of the complementary output $\overline{Q}$, the clock signal, and the 1st_Sample signal. In the example of FIG. 4, the AND gate 434 may assert the $Chg_{dn}$ signal when the output Q is a logic "0" and the Clk and 1st_Sample signals are in a logic-low state.

The $Chg_{up}$ signal controls a first set of switches 404A and 404B configured to couple current sources 435 and 436 to the capacitors $C_M$ and $C_P$, respectively. For example, activation of the $Chg_{up}$ signal may cause the switches 404A and 404B to close. As a result, current source 435 may charge capacitor $C_M$ (e.g., using reference current $I_{REF}$) while current source 436 may concurrently discharge capacitor $C_P$ (e.g., using reference current $I_{REF}$), causing the lower voltage $V_M$ to increase relative to the upper voltage $V_P$ as current flows through $C_D$ from $V_M$ to $V_P$. The $Chg_{dn}$ signal controls a second set of switches 403A and 403B configured to couple current sources 435 and 436 to the capacitors $C_P$ and $C_M$, respectively. For example, activation of the $Chg_{dn}$ signal may cause the switches 403A and 403B to close. As a result, current source 435 may charge capacitor $C_P$ while current source 436 may concurrently discharge capacitor $C_M$, causing the upper voltage $V_P$ to increase relative to the lower voltage $V_M$ as current flows through $C_D$ from $V_P$ to $V_M$. Thus, the circuit components 432-436 may function as a feedback DAC (such as the feedback DAC 318 of FIG. 3) for the delta-sigma modulator.

The up/down counter 440 is configured to convert the output Q of the flip-flop 432 to a quantized value ($ADC_{OUT}$). In some embodiments, the up/down counter 440 may count the number of logic "1's" output by the flip-flop 432 to determine a digital representation of the input signal $I_{IN}$ for a given sampling interval (e.g., burst duration). More specifically, the up/down counter 440 may increment the count value for each "1" output by the flip-flop 432, and may decrement the count value for each "0" (or "−1") output by the flip-flop 432. The final count value stored by the up/down counter 440 at the end of the sampling interval may be output as a digital representation ($ADC_{OUT}$) of the input signal $I_{IN}$.

In some embodiments, the AFE 400 may include additional switching circuitry 402A, 402B, 405A, and 405B that may be used to increase the resolution of $ADC_{OUT}$. For example, the switches 402A and 402B may switchably couple and/or decouple the current conveyor 410 to the mixer 420 based at least in part on an End_Burst signal. The switches 405A and 405B may switchably couple and/or decouple the current sources 435 and 436, respectively, from the integrators ($C_D$, $C_P$, and $C_M$) based at least in part on the 1st_Sample signal. An example operation of the AFE 400 is described below with reference to the timing diagram 500 of FIG. 5.

In the example of FIG. 5, the AFE 400 may be configured to operate in a low power (WOF) mode. Thus, the AFE 400 may wake up periodically to perform a capacitive sensing operation in a relatively short burst duration. At time $t_0$, the 1st_Sample signal is asserted while the End_Burst signal is deasserted. As a result, switches 402B, 405A, and 405B are closed, whereas switch 402A is opened. Since the clock signal is in a logic-low state at this time, switches 406A and 406B may also be open. Thus, the output of the current conveyor 410 is coupled to the input of the mixer 420, causing the input current $I_{IN}$ to charge the capacitors $C_P$ and $C_M$ (e.g., via the component currents $I_P$ and $I_M$, respectively). The switches 405A and 405B couple the respective current sources 435 and 436 to a common-mode voltage potential $V_{CM}$, thus preventing the reference current $I_{REF}$ from integrating with the component currents $I_P$ and $I_M$. At this time, the voltages $V_P$ and $V_M$ may reflect only the charge carried by the component currents $I_P$ and $I_M$.

Then, at time $t_1$, the 1st_Sample signal transitions to a logic-low state as the clock signal transitions to a logic-high state. As a result, switches 405A and 405B are opened, whereas switches 406A and 406B are closed. Because switches 406A and 406B are closed, the current sources 435 and 436 remain coupled to $V_{CM}$. Thus, the reference current $I_{REF}$ is still prevented from integrating with the component currents $I_P$ and $I_M$ at this time. In some embodiments, the duration of the 1st_Sample signal may be based at least in part on a sampling frequency ($f_S$) of the delta-sigma modulator and a return-to-zero time ($\alpha$) of the clock signal (e.g., T(1st_Sample)=$\alpha/f_S$). This allows the feedback DAC to begin adjusting the charges on the integrator as soon as the comparator 431 has sampled the voltages $V_P$ and $V_M$ (e.g., with no interference from $I_{REF}$).

From times $t_1$ to $t_2$, the AFE 400 may sample the input current $I_{IN}$ (e.g., in a conventional manner). For example, the delta-sigma modulator may convert the input current $I_{IN}$ to a series of digital pulses, and the up/down counter 440 may generate a quantized representation of the pulses as a digital output $ADC_{OUT}$.

At time $t_2$, the burst duration terminates, and the End_Burst signal is asserted as the clock signal transitions to a logic-low state. As a result, switch 402B is opened whereas switch 402A is closed, causing the current conveyor 410 to become decoupled from the mixer 420 (e.g., and the input current $A \cdot I_{IN}$ to flow to $V_{CM}$). Since the clock signal is in a logic-low state at this time, switches 406A and 406B may also be open. Thus, the current state (e.g., charge) of the capacitors $C_P$ and $C_M$ may indicate the accuracy of the least significant bit (LSB) of $ADC_{OUT}$. In other words, the capacitors $C_P$ and $C_M$ currently hold a measure of the quantization error (e.g., at time $t_2$).

For example, the voltage produced from integrating $I_{IN}$ over the burst duration ($T_{BURST}$) may be represented by:

$$V_{INT\_I_{IN}} = V_P - V_M = \frac{2 \cdot I_{IN} \cdot T_{BURST}}{2 \cdot C_D + C_C}$$

where $T_{BURST}$ is the duration from $t_0$ to $t_2$ and $C_C$ is the capacitance of each of the capacitors $C_P$ and $C_M$. By expressing $T_{BURST}$ in terms of the total number (N) of samples taken within the burst duration (e.g., $T_{BURST}$=N/$f_S$), the equation above can be reduced to:

$$V_{INT\_I_{IN}} = \frac{2 \cdot I_{IN} \cdot N}{f_S \cdot (2 \cdot C_D + C_C)}$$

For every sample in which the feedback DAC is in the loop, the current sources 435 and 436 produce the same magnitude of voltage change on the integrator $$\left( \frac{2 \cdot I_{REF} \cdot \alpha}{f_S \cdot (2 \cdot C_D + C_C)} \right).$$

Thus, the voltage change on the integrator over the entire burst duration $T_{BURST}$ can be represented as:

$$V_{INT\_I_{REF}} = \sum_{i=1}^{N-1} \frac{2 \cdot Q_i \cdot I_{REF} \cdot \alpha}{f_S \cdot (2 \cdot C_D + C_C)}$$

where $Q_i$ corresponds to the output of the 1-bit stream for the $i^{th}$ sample (e.g., output by the flip-flop 432). Thus, the voltage on the output of the integrator at the end of $T_{BURST}$ (e.g., due to $I_{IN}$ and $I_{REF}$) can be expressed as:

$$V_{INT} = \frac{2 \cdot I_{IN} \cdot N}{f_S \cdot (2 \cdot C_D + C_C)} - \sum_{i=1}^{N-1} \frac{2 \cdot Q_i \cdot I_{REF} \cdot \alpha}{f_S \cdot (2 \cdot C_D + C_C)}$$

which may be reduced to:

$$V_{INT} = \frac{2 \cdot I_{IN} \cdot N}{f_S \cdot (2 \cdot C_D + C_C)} - \left[ I_{IN} - \frac{I_{REF} \cdot \alpha}{N} \cdot (ADC_{OUT} - Q_N) \right]$$

where $ADC_{OUT}$ is the output of the up/down counter 440 and $Q_N$ is the $N^{th}$ sample of the 1-bit stream. Assuming $$V_{REF} = \frac{2 \cdot I_{REF} \cdot \alpha}{f_S \cdot (2 \cdot C_D + C_C)},$$

the above equation can be reduced to:

$$\frac{V_{INT}}{V_{REF}} = \frac{I_{IN} \cdot N}{I_{REF} \cdot \alpha} - ADC_{OUT} + Q_N$$

If the output of the feedback DAC (e.g., based on the state of $Q_N$) is integrated with $I_{IN}$=0 (e.g., at the end of the burst), then this extended "sampling" can be expressed as:

$$\frac{V_{INT\_EXTENDED}}{V_{REF}} = \frac{I_{IN} \cdot N}{I_{REF} \cdot \alpha} - ADC_{OUT}$$

It is noted that the above equation represents the quantization noise of a non-oversampled ADC. Thus, the equation indicates that the integrator holds a measure of the quantization error based on the extra "sample" taken at the end of the burst duration (e.g., when the current conveyor 410 is decoupled from the mixer 420). In some embodiments, the quantization error may be used to halve the quantization noise in $ADC_{OUT}$:

$$ADC_{OUT\_EXTENDED} = ADC_{OUT} + 0.5 \cdot (1 + \text{sign}(V_{INT\_EXTENDED}))$$

Thus, at time $t_3$, the output of the comparator 431 may be sampled to determine a measure of the quantization error (Q_Error) in $ADC_{OUT}$. For example, if Q_Error is a logic "0" then the quantization error may be below a threshold level (e.g., for the LSB). Thus, the output of the AFE 400 may be left unadjusted. However, if Q_Error is a logic "1" then the quantization error may be above the threshold level. Thus, the output of the AFE may be incremented by 1 bit. In some embodiments, the quantization-noise adjustment may be implemented, at least in part, by the up/down counter 440. In other embodiments, the quantization-noise adjustment may be implemented by other circuitry in the AFE 400 (e.g., the filter 218 of FIG. 2).

FIG. 6 shows a block diagram of an input device 600 with QN adjustment capabilities, in accordance with some embodiments. The input device 600 may be an example embodiment of any of the input devices 100 and/or 200 depicted in FIGS. 1 and 2. In some embodiments, the input device 600 may include a sensor interface 610, a processor 620, and a memory 630.

The sensor interface 610 may be coupled to a plurality of sensor electrodes configured for capacitive sensing (such as sensor electrodes 121 of FIG. 1). More specifically, the sensor interface 610 may be used to communicate with the sensor electrodes when operating in a capacitive sensing mode. For example, the sensor interface 610 may transmit signals to a transmitter electrode and receive resulting signals from a receiver electrode. In some embodiments, the sensor interface 610 may switchably couple and/or decouple the input device 600 from the sensor electrodes.

The memory 630 may include a non-transitory computer-readable medium (e.g., one or more nonvolatile memory elements, such as EPROM, EEPROM, Flash memory, a hard drive, etc.) that may store at least the following software (SW) modules:

- a wake-on-finger (WOF) SW module 631 to operate the input device 600 in a low power mode when no user inputs (or input objects) are detected by the sensor electrodes;
- a capacitive sensing SW module 632 to measure a capacitance of the sensor electrodes when operating in the capacitive sensing mode, the capacitive sensing SW module 632 including:
  - an analog-to-digital conversion (ADC) submodule 633 to convert an analog input signal received from the sensor electrodes to a digital output value (e.g., corresponding to a quantized representation of the input signal); and
- a quantization noise (QN) adjustment SW module 634 to selectively adjust the digital output value based at least in part on a measure of the quantization noise in the analog-to-digital conversion, the QN adjustment SW module 634 including:
  - a quantization error submodule 635 to measure an amount of quantization error in the digital output value when the input device 600 is decoupled from the sensor electrodes; and
  - an output correction submodule 636 to increment or maintain the digital output value based at least in part on the amount of quantization error.

Each software module includes instructions that, when executed by the processor 620, cause the input device 600 to perform the corresponding functions. The non-transitory computer-readable medium of memory 630 thus includes instructions for performing all or a portion of the operations described below with respect to FIG. 7.

Processor 620 may be any suitable one or more processors capable of executing scripts or instructions of one or more software programs stored in the input device 600 (e.g. within memory 630). For example, the processor 620 may execute the WOF SW module 631 to operate the input device 600 in a low power mode when no user inputs (or input objects) are detected by the sensor electrodes. The processor 620 may also execute the capacitive sensing SW module 632 to measure a capacitance of the sensor electrodes when operating in the capacitive sensing mode. In executing the capacitive sensing SW module 632, the processor 620 may further execute the ADC submodule 633 to convert an analog input signal received from the sensor electrodes to a digital output value (e.g., corresponding to a quantized representation of the input signal).

The processor 620 may also execute the QN adjustment SW module 634 to selectively adjust the digital output value based at least in part on a measure of the quantization noise in the analog-to-digital conversion. In executing the QN adjustment SW module 634, the processor 620 may further execute the quantization error submodule 635 and the output correction submodule 636. For example, the processor 620 may execute the quantization error submodule 635 to measure an amount of quantization error in the digital output value when the input device 600 is decoupled from the sensor electrodes. The processor 620 may further execute the output correction submodule 636 to increment or maintain the digital output value based at least in part on the amount of quantization error.

FIG. 7 shows an illustrative flowchart depicting an example operation 700 for selectively adjusting a digital output of an analog-to-digital converter (ADC), in accordance with some embodiments. With reference for example to FIG. 2, the operation 700 may be performed by the input device 200 to process input signals $I_{IN}$ received from a plurality of sensor electrodes (e.g., sensor electrodes $205_A$ and $205_B$). More specifically, the operation 700 may generate a quantized representation of the analog input signals $I_{IN}$.

The input device 200 may couple an analog front end (AFE) to one or more sensor electrodes (710). For example, the AFE 210 may include a current conveyor 212 having an output switchably coupled to the input of a mixer 214 (e.g., and ADC 216) via switching circuitry 202. The input of the current conveyor may be coupled to a sensor electrode (such as sensor electrode $205_B$). When a capacitive sensing operation is to be performed, the switching circuitry 202 couples the current conveyor 212 to the mixer 214 (e.g., when the End_Burst signal is deasserted). This allows the mixer 214 and ADC 216 to receive an amplified (or attenuated) input signal $A \cdot I_{IN}$ from the current conveyor 212.

The input device 200 may then receive an input signal from the one or more sensor electrodes (720). In some embodiments, the current conveyor 212 may transmit and receive signals across the sensor electrodes $205_A$ and $205_B$ by biasing the voltages $V_S$ and $V_C$. For example, the current conveyor 212 may "transmit" a signal from sensor electrode $205_A$ to sensor electrode $205_B$ by varying at least one of the voltages $V_S$ and/or $V_C$ relative to the other. This AC voltage creates a time-varying input current $I_{IN}$ that across the sensor electrodes $205_A$ and $205_B$. The current conveyor 212 may receive the input current $I_{IN}$ via the sensor electrode $205_B$, and may output an amplified (or attenuated) version of the input current $I_{IN}$.

The input device 200 may generate an output value corresponding to a digital representation of the input signal (730). For example, the ADC 216 may receive and sample the input current $I_{IN}$ from the mixer 214. In some embodiments, the ADC 216 may first convert the analog input current to a digital bit stream and then convert the digital bit stream to a quantized value. For example, the ADC 216 may comprise a delta-sigma modulator and a decimation filter. The delta-sigma modulator generates a single-bit stream by sampling the input current $I_{IN}$ at a sampling frequency of its internal clock. The decimation filter may count the number of pulses (or bits) in the series of samples generated by the delta-sigma modulator to convert the digital bit stream to a quantized value.

The input device 200 may then decouple the AFE 210 from the sensor electrodes (740). For example, the switching circuitry 202 may decouple the current conveyor 212 form the mixer 214 at the end of a sampling (or burst) duration (e.g., when the End_Burst signal is asserted). This prevents the input current $I_{IN}$ from entering the mixer 214 and/or being sampled by the ADC 216 once the sampling interval has terminated. In some embodiments, the ADC 216 may continue to generate additional "samples" even after the mixer 214 has been decoupled from the current conveyor 212. With reference for example to FIG. 3, the delta-sigma modulator 310 may continue to update the single-bit stream $\Delta\Sigma_{OUT}$ based at least in part on the residual charge stored in the integrator 314.

The input device 200 may selectively adjust the output value based at least in part on the state of the AFE 210 when decoupled from the sensor electrodes (750). As described above, the extended "sampling" performed by the ADC 216 (e.g., after the mixer 214 has been decoupled from the current conveyor 212) may reflect an amount of quantization error in the digital output of the ADC 216. In some embodiments, the filter 218 may receive the additional sample as a Q_Error signal from the ADC 216. The filter 218 may then selectively adjust the output of the ADC 216 based at least in part on the received quantization error. For example, in some aspects, the filter 218 may increment (or decrement) the output value if the quantization error exceeds a threshold amount. In other aspects, the filter 218 may maintain the output value (e.g., without any adjustment) if the quantization error does not exceed the threshold amount.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An analog front end (AFE) for an input device, comprising:
   a current conveyor comprising an amplifier configured to receive an input signal from a plurality of sensor electrodes; and
   an analog-to-digital converter (ADC) switchably coupled to the current conveyor, the ADC configured to:
   generate an output value corresponding to a digital representation of the input signal when the ADC is coupled to the current conveyor; and
   selectively adjust the output value based at least in part on a state of the ADC when the ADC is decoupled from the current conveyor, wherein the input signal is not provided to the ADC when the ADC is decoupled from the current conveyor.

2. The AFE of claim 1, further comprising switching circuitry configured to:

couple the ADC to the current conveyor during a sampling interval; and decouple the ADC from the current conveyor upon termination of the sampling interval.

3. The AFE of claim 2, wherein the sampling interval coincides with a low power mode of the AFE.

4. The AFE of claim 1, wherein the ADC includes:
a delta-sigma modulator configured to generate a series of samples based at least in part on the received input signal; and
a decimation filter configured to convert the series of samples to the output value when the ADC is coupled to the current conveyor.

5. The AFE of claim 4, wherein the delta-sigma modulator is further configured to generate an additional sample when the ADC is decoupled from the current conveyor.

6. The AFE of claim 5, wherein the ADC is configured to selectively adjust the output value by:
determining an amount of quantization error in the output value based on the additional sample; and
adjusting the output value when the amount of quantization error exceeds a threshold amount.

7. The AFE of claim 6, wherein the decimation filter comprises an up-down counter, and wherein the ADC is further configured to selectively adjust the output value by:
incrementing the output value when the amount of quantization error exceeds the threshold amount; and
maintaining the output value when the amount of quantization error does not exceed the threshold amount.

8. The AFE of claim 4, wherein the delta-sigma modulator includes an integrator and a feedback digital-to-analog converter (DAC), and wherein the ADC is further configured to decouple the feedback DAC from the integrator prior to generating a first sample in the series of samples.

9. The AFE of claim 8, wherein the ADC is configured to couple the feedback DAC to the integrator a threshold period after receiving the input signal from the current conveyor.

10. The AFE of claim 9, wherein the threshold period is based at least in part on a sampling frequency of the delta-sigma modulator and a return-to-zero time of a clock signal used to control the sampling frequency.

11. A method of operating an analog front end (AFE) switchably coupled to a plurality of sensor electrodes, the method comprising:
receiving an input signal from the plurality of sensor electrodes;
generating an output value corresponding to a digital representation of the input signal when the AFE is coupled to the plurality of sensor electrodes, the output value being generated by an analog-to-digital converter (ADC); and
selectively adjusting the output value based at least in part on a state of the AFE when the AFE is decoupled from the plurality of sensor electrodes, wherein the input signal is not provided to the ADC when the AFE is decoupled from the plurality of sensor electrodes.

12. The method of claim 11, further comprising:
coupling the AFE to the plurality of sensor electrodes during a sampling interval; and
decoupling the AFE from the plurality of sensor electrodes upon termination of the sampling interval.

13. The method of claim 12, wherein the sampling interval coincides with a low power mode of the AFE.

14. The method of claim 11, further comprising:
generating a series of samples based at least in part on the received input signal; and
converting the series of samples to the output value when the AFE is coupled to the plurality of sensor electrodes.

15. The method of claim 14, wherein the selectively adjusting comprises:
generating an additional sample when the AFE is decoupled from the plurality of sensor electrodes;
determining an amount of quantization error in the output value based on the additional sample; and
adjusting the output value when the amount of quantization error exceeds a threshold amount.

16. The method of claim 15, wherein the selectively adjusting further comprises:
incrementing the output value when the amount of quantization error exceeds the threshold amount; and
maintaining the output value when the amount of quantization error does not exceed the threshold amount.

17. The method of claim 14, wherein the AFE includes a delta-sigma modulator, the method further comprising:
decoupling a feedback digital-to-analog converter (DAC) of the delta-sigma modulator from an integrator of the delta-sigma modulator prior to generating a first sample in the series of samples.

18. The method of claim 17, further comprising:
coupling the feedback DAC to the integrator a threshold period after receiving the input signal from the plurality of sensor electrodes.

19. The method of claim 18, wherein the threshold period is based at least in part on a sampling frequency of the delta-sigma modulator and a return-to-zero time of a clock signal used to control the sampling frequency.

20. An input device, comprising:
a plurality of sensor electrodes; and
an analog front end (AFE) switchably coupled to the plurality of sensor electrodes, the AFE configured to:
receive an input signal from the plurality of sensor electrodes;
generate an output value corresponding to a digital representation of the input signal when the AFE is coupled to the plurality of sensor electrodes, the output value being generated by an analog-to-digital converter (ADC); and
selectively adjust the output value based at least in part on a state of the AFE when the AFE is decoupled from the plurality of sensor electrodes, wherein the input signal is not provided to the ADC when the AFE is decoupled from the plurality of sensor electrodes.

* * * * *